(12) United States Patent  
Lipson et al.

(10) Patent No.: US 9,195,148 B2  
(45) Date of Patent: Nov. 24, 2015

(54) SIDE SEAL FOR WET LENS ELEMENTS

(75) Inventors: Matthew Lipson, Stamford, CT (US); Taras Shvets, Stamford, CT (US); Richard Bruls, Eindhoven (NL)

(73) Assignee: ASML Holding N.V., Veldhoven (NL)

(*) Notice: Subject to any disclaimer, the term of this patent is extended or adjusted under 35 U.S.C. 154(b) by 1160 days.

(21) Appl. No.: 12/834,996

(22) Filed: Jul. 13, 2010

(65) Prior Publication Data

US 2010/0271605 A1 Oct. 28, 2010

Related U.S. Application Data

(60) Division of application No. 11/473,068, filed on Jun. 23, 2006, now Pat. No. 7,781,029, which is a continuation-in-part of application No. 10/253,655, filed on Sep. 25, 2002, now Pat. No. 7,081,278.

(51) Int. Cl.
*G03B 27/52* (2006.01)
*G03B 27/54* (2006.01)
(Continued)

(52) U.S. Cl.
CPC ............ *G03F 7/70341* (2013.01); *G02B 1/105* (2013.01); *G02B 5/003* (2013.01); *G02B 7/025* (2013.01); *Y10T 156/10* (2015.01)

(58) Field of Classification Search
CPC ............ G03F 7/70316; G03F 7/70341; G03F 7/70833; G03F 7/70883; G03F 7/70908; G03F 7/70916; G03F 7/70958; G03F 7/70983; G02B 1/105; G02B 7/025; G02B 5/003
USPC ........................ 355/30, 52, 53, 55, 67–71, 77; 250/492.1, 492.2, 492.22, 548; 430/5, 430/8, 22, 30, 311, 312, 321, 322, 394; 427/160, 508, 512, 553; 359/361, 355, 359/507–514, 819

See application file for complete search history.

(56) References Cited

U.S. PATENT DOCUMENTS 1,507,327 A 9/1924 Wrighton
3,851,621 A 12/1974 Shepard
(Continued)

FOREIGN PATENT DOCUMENTS

DE 1 011 589 7/1957
EP 1277571 A1 1/2003
(Continued)

OTHER PUBLICATIONS

English-Abstract for Japanese Patent Publication No. 11-256342, published Sep. 21, 1999, printed from http://v3.espace.com, 1 page.
(Continued)

*Primary Examiner* — Christina Riddle
(74) *Attorney, Agent, or Firm* — Sterne, Kessler, Goldstein & Fox P.L.L.C.

(57) ABSTRACT

A method for protecting a wet lens element from liquid degradation is provided. The method includes applying a thin coating of an organoxy-metallic compound to the side portions of a wet lens element to leave behind an optically inert, light absorbing metal oxide film. A liquid shield coating is applied on top of the metal oxide coating. The two coating layers protect the wet lens element from liquid degradation when the side portion of the wet lens element is submerged into a liquid. In an embodiment, the wet lens element is an immersion lithography wet lens element and the liquid is an immersion lithography liquid.

21 Claims, 7 Drawing Sheets

(51) Int. Cl.
*G03B 27/32* (2006.01)
*G03F 7/20* (2006.01)
*G02B 1/10* (2015.01)
*G02B 5/00* (2006.01)
*G02B 7/02* (2006.01)

(56) References Cited

U.S. PATENT DOCUMENTS

| | | | | |
|---|---|---|---|---|
| 3,935,367 | A * | 1/1976 | Merrill et al. | 428/336 |
| 3,953,115 | A | 4/1976 | French et al. | |
| 4,222,747 | A | 9/1980 | Dauguet et al. | |
| 4,643,911 | A | 2/1987 | Inoue et al. | |
| 4,824,712 | A | 4/1989 | Falleroni et al. | |
| 4,842,941 | A | 6/1989 | Devins et al. | |
| 4,904,525 | A | 2/1990 | Taniguchi et al. | |
| 4,976,998 | A | 12/1990 | Morimitu et al. | |
| 5,110,707 | A * | 5/1992 | Fujita et al. | 430/256 |
| 5,115,346 | A * | 5/1992 | Lynam | 359/604 |
| 5,449,534 | A | 9/1995 | Oishi et al. | |
| 5,908,705 | A | 6/1999 | Nguyen et al. | |
| 6,017,609 | A | 1/2000 | Akamatsu et al. | |
| 6,097,536 | A | 8/2000 | Bauer et al. | |
| 6,180,188 | B1 | 1/2001 | Belleville et al. | |
| 6,309,755 | B1 | 10/2001 | Matsco et al. | |
| 6,352,747 | B1 | 3/2002 | Blackburn et al. | |
| 6,394,613 | B1 * | 5/2002 | Hatakeyama et al. | 359/507 |
| 6,417,974 | B1 * | 7/2002 | Schuster | 359/754 |
| 6,448,304 | B1 * | 9/2002 | Kosaka et al. | 523/106 |
| 6,574,039 | B1 * | 6/2003 | Murata et al. | 359/359 |
| 6,655,946 | B2 | 12/2003 | Foreman et al. | |
| 7,081,278 | B2 | 7/2006 | Lipson et al. | |
| 7,781,029 | B2 | 8/2010 | Lipson et al. | |
| 2002/0163629 | A1 | 11/2002 | Switkes et al. | |
| 2004/0058061 | A1 * | 3/2004 | Lipson et al. | 427/162 |
| 2005/0094119 | A1 * | 5/2005 | Loopstra et al. | 355/67 |
| 2005/0100745 | A1 * | 5/2005 | Lin et al. | 428/446 |
| 2005/0225737 | A1 * | 10/2005 | Weissenrieder et al. | 355/53 |
| 2006/0203218 | A1 * | 9/2006 | Shirai et al. | 355/53 |
| 2006/0291060 | A1 * | 12/2006 | Shirai et al. | 359/582 |
| 2007/0152170 | A1 * | 7/2007 | Pollentier | 250/492.2 |
| 2007/0201011 | A1 * | 8/2007 | Kokubun et al. | 355/53 |

FOREIGN PATENT DOCUMENTS

| | | | | |
|---|---|---|---|---|
| JP | 11-25509 | A | 5/1989 | |
| JP | 06-087151 | A | 3/1994 | |
| JP | 06-300953 | A | 10/1994 | |
| JP | 11-014876 | A | 1/1999 | |
| JP | 2001-511717 | T | 8/2001 | |
| JP | 2002-189082 | A | 7/2002 | |
| WO | WO 01/31401 | A1 | 5/2001 | |
| WO | WO 2005020298 | A1 * | 3/2005 | H01L 21/027 |

OTHER PUBLICATIONS

English-Abstract for Japanese Patent Publication No. 4-295810, published Oct. 20, 1992, printed from http://v3.espace.com, 1 page.
Final Rejection mailed Dec. 14, 2005 for U.S. Appl. No. 10/253,655, filed Sep. 25, 2002, 15 pgs.
Final Rejection mailed Jan. 11, 2005 for U.S. Appl. No. 10/253,655, filed Sep. 25, 2002, 15 pgs.
Non-Final Rejection mailed Jul. 20, 2004 for U.S. Appl. No. 10/253,655, filed Sep. 25, 2002, 18 pgs.
Non-Final Rejection mailed Jun. 24, 2005 for U.S. Appl. No. 10/253,655, filed Sep. 25, 2002, 7 pgs.
Notice of Allowance mailed Mar. 8, 2006 for U.S. Appl. No. 10/253,655, filed Sep. 25, 2002, 8 pgs.
Notification of Reason(s) for Refusal mailed Apr. 7, 2009 for Japanese Patent Application No. 2003-334005, 4 pgs.
Final Rejection mailed Sep. 25, 2009 for U.S. Appl. No. 11/473,068, filed Jun. 23, 2006, 8 pgs.
Final Rejection mailed Mar. 24, 2010 for U.S. Appl. No. 11/473,068, filed Jun. 23, 2006, 8 pgs.
Non-Final Rejection mailed May 11, 2009 for U.S. Appl. No. 11/473,068, filed Jun. 23, 2006, 7 pgs.
Non-Final Rejection mailed Nov. 20, 2009 for U.S. Appl. No. 11/473,068, filed Jun. 23, 2006, 8 pgs.
Notice of Allowance mailed May 14, 2010 for U.S. Appl. No. 11/473,068, filed Jun. 23, 2006, 6 pgs.
Search Report from European Patent Application No. 03021738.4 dated Feb. 26, 2004, 3 pgs.
Search Report from Singapore Patent Application No. 200305614-0, dated Sep. 23, 2003, 6 pgs.
Qin Dong, et al. Microfabrication, Microstructures and Microsystems, Topics in Current Chemistry, vol. 194, (1998) pp. 1-17.

* cited by examiner

A-A CROSS SECTION

A-A CROSS SECTION

SIDE SEAL FOR WET LENS ELEMENTS

CROSS REFERENCE TO RELATED APPLICATIONS

This application is a divisional of U.S. patent application Ser. No. 11/473,068, filed on Jun. 23, 2006 (now U.S. Pat. No. 7,781,029), which is a continuation-in-part of U.S. patent application Ser. No. 10/253,655, filed on Sep. 25, 2002, (now U.S. Pat. No. 7,081,278) both of which are incorporated by reference herein in their entirety.

BACKGROUND

1. Field of the Invention

The present invention relates to immersion lithography, more particularly, to providing side seals for a wet lens element to protect the wet lens element from degradation.

2. Related Art

Lithography is a process used to create features on the surface of substrates. Such substrates can include those used in the manufacture of flat panel displays (e.g., liquid crystal displays), semiconductor wafers, circuit boards, various integrated circuits, print heads, macro/nano-fluidic substrates, and the like. During lithography, a substrate, which is disposed on a substrate stage, is exposed to an image projected onto the surface of the substrate by exposure optics located within a lithography apparatus.

The projected image produces changes in the characteristics of a layer, for example, photoresist, deposited on the surface of the substrate. These changes correspond to the features projected onto the substrate during exposure. Subsequent to exposure, the layer can be etched or otherwise processed to produce a patterned layer. The pattern corresponds to those features projected onto the substrate during exposure. The patterned layer is then used to remove or further process exposed portions of underlying structural layers within the substrate, such as conductive, semiconductive, or insulative layers. This process is repeated, together with other steps, until the desired features have been formed on the surface, or in various layers, of the substrate.

In the field of immersion lithography the exposure operation is conducted with an immersion liquid, which is typically water, between the last lens element of the projection lens and the substrate. This requires certain design modifications to the apparatus. A number of such lithographic apparatus use calcium fluoride ($CaF_2$) lenses as the last element in the projection lens. This element is therefore constantly in contact with the immersion liquid. To achieve the required optical properties such immersion lithography apparatus often use ultra pure water ("UPW"). Unfortunately, calcium fluoride dissolves in ultra pure water and the lens needs to be protected from the water in order to prevent surface damage that can lead to unwanted scattering of light. For example, when calcium fluoride dissolves into the immersion liquid, some of the calcium fluoride will crystallize onto a work surface, such as a wafer, from microdroplets that are left behind. These microdroplets can lead to imperfections in the printed image on a wafer or other work surface.

Non-optical areas of the lens also dissolve calcium flouride into the water. Due to the water conditions, the rate of dissolution far exceeds the purity specifications of the water. Consequently, the purity of the water (or other liquid) is affected which leads to defects to wafers or other surfaces. It is therefore necessary to protect both the optical surfaces of a lens and the non-optical sides of the lens that come in contact with the water.

What is needed is a method for protecting the non-optical sides of a wet lens element from degradation which are immersed in a liquid.

SUMMARY

The present invention is directed to a method for protecting a wet lens element from liquid degradation. The method includes applying a thin coating of an organoxy-metallic compound to the side portions of a wet lens element to leave behind an optically inert, light absorbing metal oxide film. A liquid shield coating is applied on top of the metal oxide coating. The two coating layers protect the wet lens element from liquid degradation when the side portion of the wet lens element is submerged into a liquid. In an embodiment, the wet lens element is an immersion lithography wet lens element and the liquid is an immersion lithography liquid.

Treatment of a wet lens element using the current invention provides several benefits. First, the combination of a liquid shield coating and the metal oxide coating prevent the side portions of a wet lens element from significant degradation when immersed in a liquid.

Second, applying the metal oxide coating to an optical element using the current invention reduces the light-induced deterioration of a liquid shield coating used to protect the side portions of a wet lens element from liquid degradation. Ordinarily, ultra-violet light will be internally scattered and propagated to points on an optical element where a liquid shield has been applied. The light emitted will impinge upon the liquid shield resulting in deterioration of the bond between the liquid shield and the lens. Ultimately, deterioration can result in the liquid shield falling off of the lens. The present invention will prevent the liquid shield deterioration and resulting undesirable affects. The coatings applied also have the advantage of being robust to handling and cleaning of the wet lens element.

Moreover, there are several advantages of the present invention over other methods that might be adapted to apply a coating to prevent degradation of a wet lens element. There are numerous types of systems to apply thin coatings to polished surfaces of optical elements. These systems are very expensive, require extensive set-up time, and, in particular, do not provide a cost-effective way to coat the edge of an optical element. Their design limits their ability to apply a thin coating to the edge of an optical element. Retrofitting or adapting these systems to apply a coating to an edge is time-consuming and costly, and often, cost prohibitive. The application steps of the present invention do not require high precision, and thus do not require expensive application apparatus.

Even assuming that existing systems could be modified to apply a thin coating to the side portions of wet lens elements, the present invention offers additional advantages. Existing systems used to apply thin coatings to polished optical surfaces are designed to apply a coating with a very precise thickness. Such precision is not necessary when applying a coating to an optical element to prevent degradation of the side portion of a wet lense element when the optical element is placed in an immersion liquid. Thus, using modified current coating systems would be more expensive and time consuming than the use of the current invention because of the system setup time needed and the additional complexities associated with working with systems designed to be very precise.

Further embodiments, features, and advantages of the present invention, as well as the structure and operation of the various embodiments of the present invention are described in detail below with reference to accompanying drawings.

BRIEF DESCRIPTION OF THE FIGURES

The present invention is described with reference to the accompanying drawings. In the drawings, like reference numbers indicate identical or functionally similar elements. The drawing in which an element first appears is indicated by the left-most digit in the corresponding reference number.

DETAILED DESCRIPTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

Figure 1:
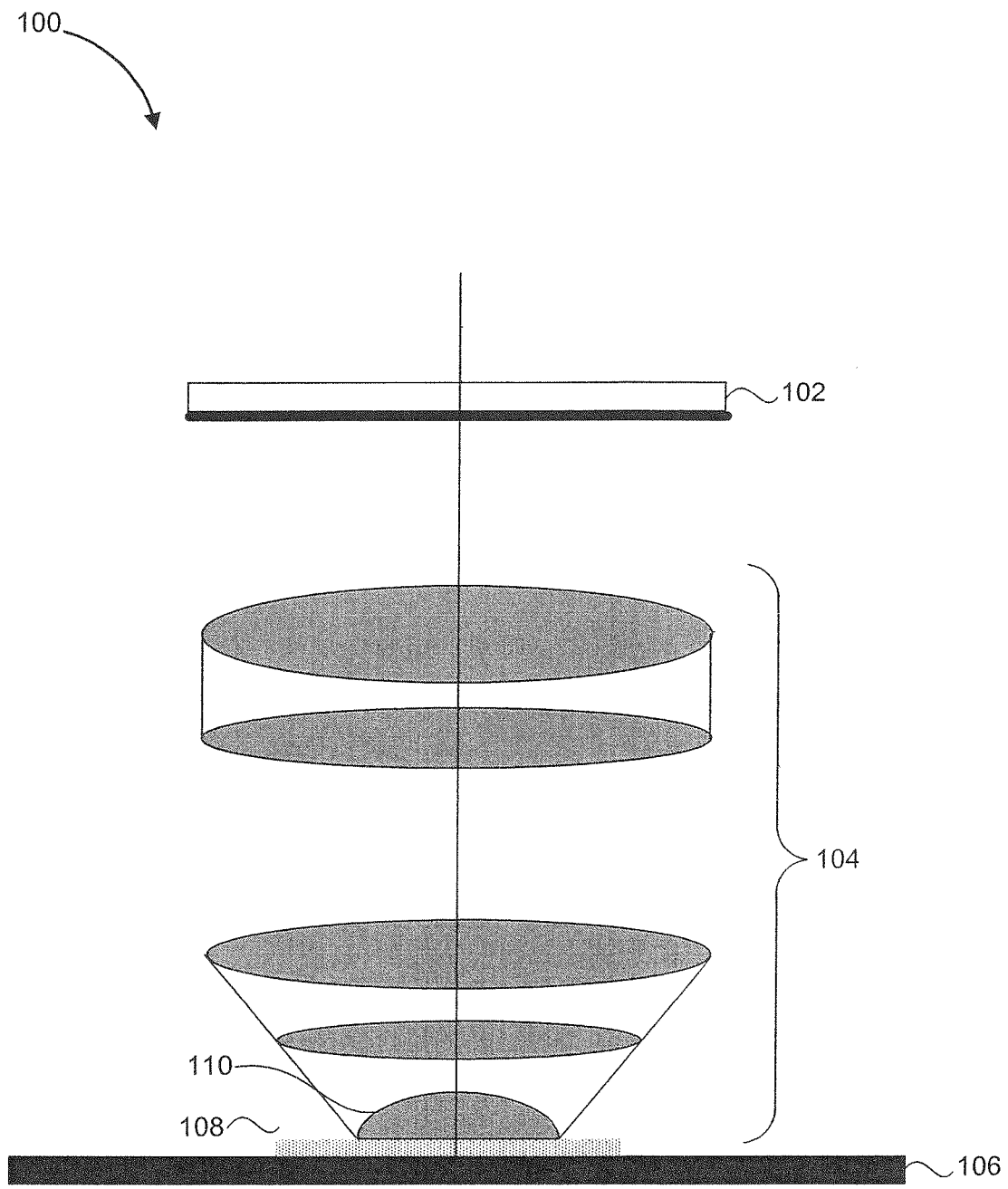
FIG. 1 is a block diagram of an immersion lithography system.

In immersion lithography systems, liquid is injected into the space between the projection optical system ("POS") exit window and the substrate surface. FIG. 1 is a block diagram of a typical immersion lithography system 100. System 100 includes a pattern generator 102, a POS 104, and a substrate 106. In order to completely expose substrate 106, substrate 106 moves relative to POS 104. Immersion liquid 108 fills the space between substrate 106 and an exit POS element or wet lens element 110.

Figure 2A:
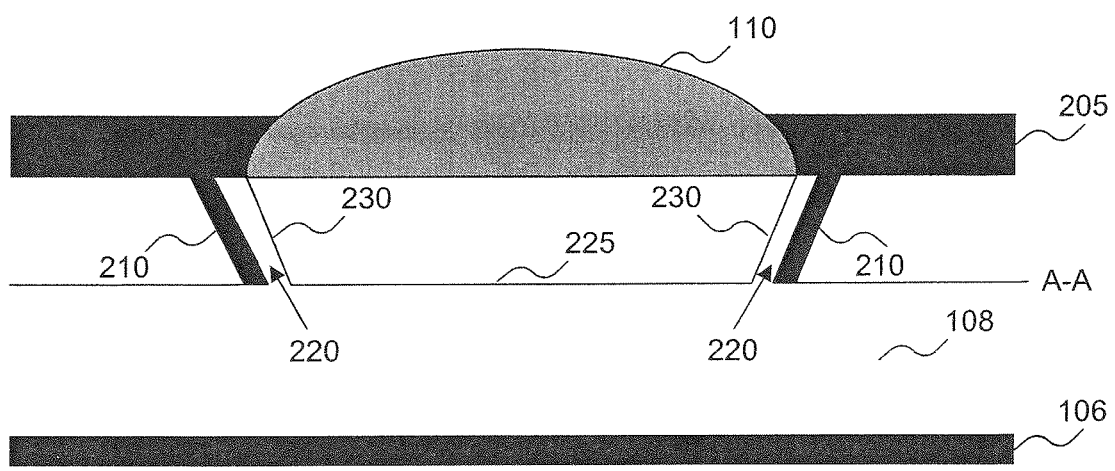
FIG. 2A is a side view of a mechanical side seal for a wet lens element, according to an embodiment of the invention.
Figure 2B:
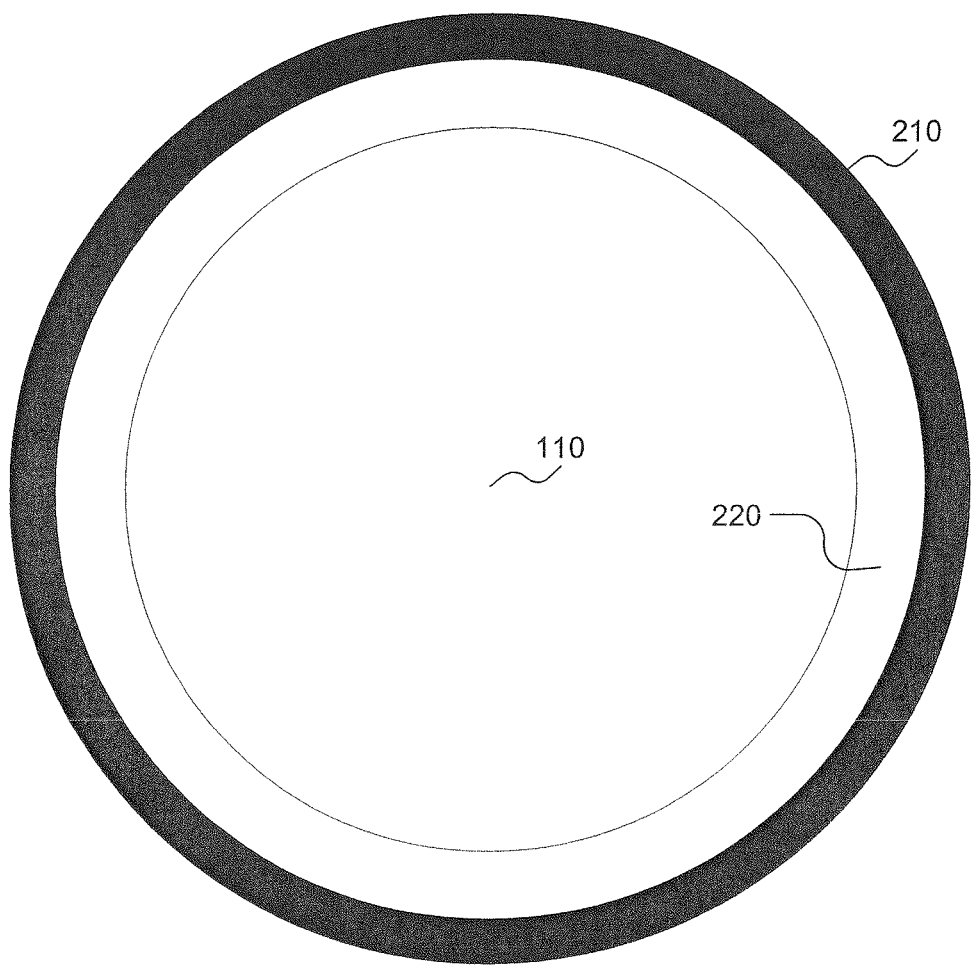
FIG. 2B is a cross sectional view of a mechanical side seal, according to an embodiment of the invention.

FIG. 2A illustrates a side view of a mechanical side seal 210 for a wet lens element 110, according to an embodiment of the invention. This is one possible approach for preventing deterioration of the sides of a lens that are in contact with an immersion liquid. FIG. 2B illustrates a cross sectional view of mechanical side seal 210, according to an embodiment of the invention. Mechanical side seal 210 is a thin sheet of non-polluting material (e.g., quartz, fluoroelastomer, or metal) that wraps around the non-optical areas of wet lens element 110 to form a mechanical shield between liquid 108 and wet lens element 110. As discussed above, wet lens element 110 can be made of $CaF_2$. Mechanical side seal 210 can either be connected to lens mount 205, as shown in FIG. 2A, or to wet lens element 110 outside the wetted areas. At the interface between the optical areas, such as optical surface 225 and non-optical or side areas 230 of the lens, a small gap 220, typically the average of which is around 150 microns, is provided to eliminate possible deformations of optical surface 225.

Liquid will penetrate gap 220, and fill the volume between mechanical side seal 210 and wet lens element 110. As a result, $CaF_2$ from wet lens element 102 will still dissolve into the thin film volume of water between side seal 210 and wet lens element 110. However, the amount of area that is able to exchange Ca or F into the ultra pure water is reduced to the small gap 220. This arrangement significantly reduces the impurities from the lens into the immersion liquid and reduces impairments that may result to a work surface, such as a wafer.

Figure 3:
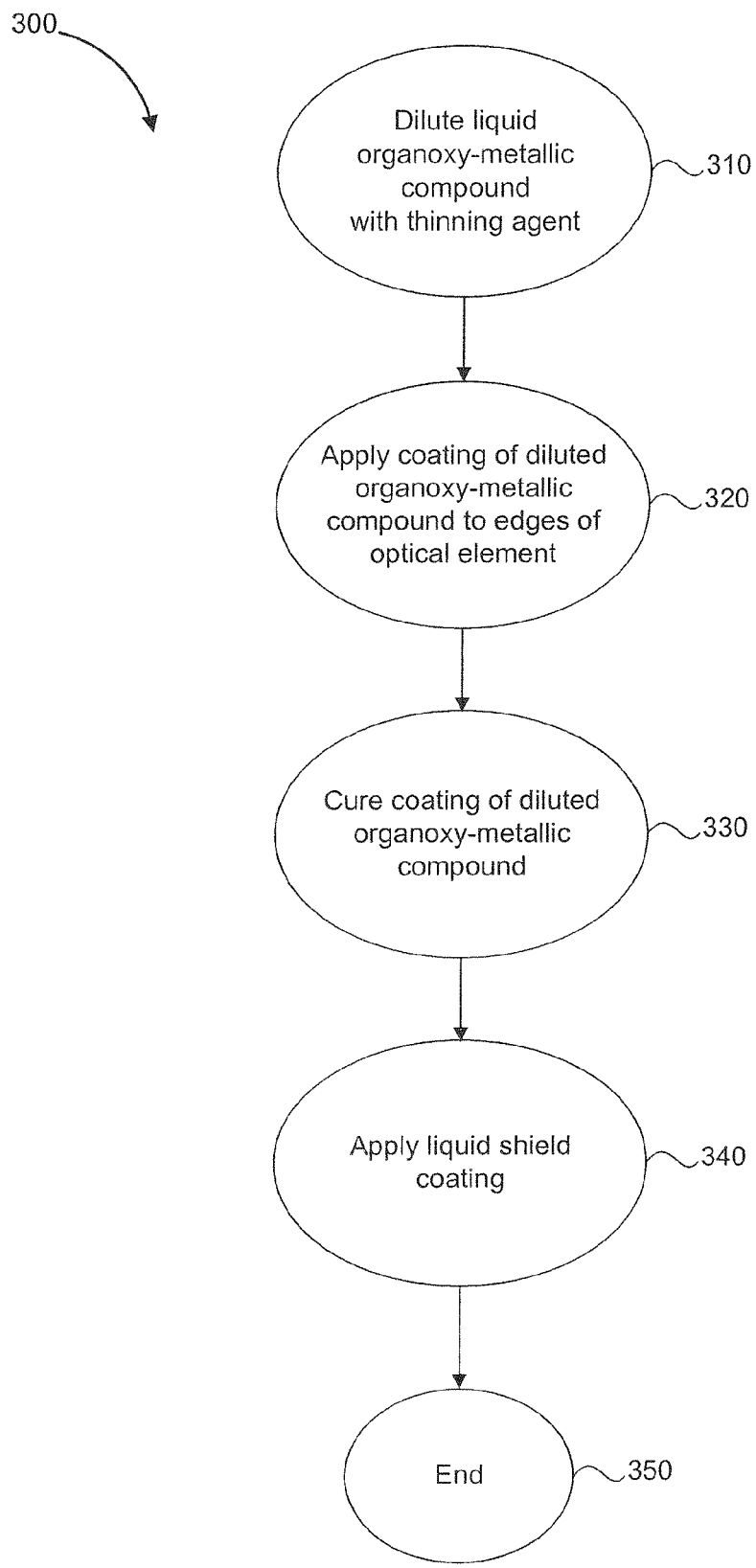
FIG. 3 is a flowchart diagram that shows a method for protecting a wet lens element from liquid degradation, according to an embodiment of the present invention.

Another approach to protecting a wet lens element from liquid degradation includes applying a series of coatings to the non-optical areas of a wet lens element that are exposed to a liquid in an immersion lithography apparatus. FIG. 3 is used to describe this approach.

FIG. 3 is a flowchart of method 300 to protect a wet lens element from liquid degradation, according to an embodiment of the present invention. The method 300 begins with a step 310. In step 310, a liquid organoxy-metallic compound is diluted with a thinning agent. Example thinning agents include, but are not limited to 1-butanol, 99.8%, anhydrous; ethyl acetate, 99.8%, HPLC grade; and dichloromethane, 99.8%, anhydrous. These thinning agents are commonly used and available from multiple suppliers with identical specifications. Other thinning agents will be known to persons skilled in the relevant art(s) from the teachings herein.

In one embodiment of the invention, the organoxy-metallic compound is titanium (IV) butoxide, which is generally available from Aldrich Chemical Company, Milwaukee, Wis. Examples of other organoxy-metallic compounds that may be used include, but are not limited to, the families of titanium (IV) alkoxides which are converted to the metal oxides, such as titanium dioxide. Other organoxy-metallic compounds that can be used in connection with the present invention will become apparent to persons skilled in the relevant art(s) from the teachings herein.

A preferred ratio of thinning agent to organoxy-metallic compound is about one to one. Alternative ratios may be used ranging from a ratio of about one part thinning agent to three parts liquid inorganic material, to a ratio of about three parts thinning agent to one part liquid inorganic material. Alternatively, no thinning agent may be used.

In a step 320, the diluted organoxy-metallic compound is applied to non-optical areas 230 creating a coating. The coating covers non-optical areas from optical surface 225 to a point on non-optical area 230 that will not be immersed in liquid. The coating may range in thickness from about one nanometer to about two hundred micrometers.

In one embodiment, the diluted organoxy-metallic compound is manually applied using an optical applicator cloth. Other applicators, such as a brush, sponge, blade, or the like, may be used in either approach and will become apparent to persons skilled in the relevant art(s) from the teachings herein.

In a step 330, the coating is exposed in ambient air to ultra-violet light and cured to form the light absorbing coating. Broad band ultra-violet light from a Hg or Xe source may be used. Alternatively, monochromatic ultra-violet light from an excimer laser may also be used and be effective in curing the coating. For example, the inventors used three DYMAX 50 WATT (bulb #35003) fiberoptic ultra-violet curing lamps to cure a titanium dioxide coated area. The fibers on the lamps were about one inch from the sample, and the exposure time for the sample was about 20 minutes. If a diluting agent is used, the organoxy-metallic compound should set for a sufficient period of time to allow the diluting agent to evaporate.

The coating must be optically opaque to the ultra-violet wavelengths that may damage subsequent coatings as discussed below (e.g., 157 nm, 193 nm, and 248 nm). In addition, the coating must be mechanically robust and must withstand routine handling of the optical element. Metal oxide films with the appropriate characteristics of optical absorption, optical transmission, mechanical robustness, and ability to adhere to optical materials, include, but are not limited to $SiO_2$, $Al_2O_5$, $ZrO_2$, $HfO_2$, $Ta_2O_5$, $Nb_2O_5$, and $TiO_2$.

In a step 340, the light absorbing coating is covered with a liquid shield coating, also referred to as a water resistant coating. Water resistant coatings with appropriate characteristics include polyurethane, ultra-violet polyurethane (e.g., DYMAX 901), silicon caulks and organic encapsulates. When using polyurethane the thickness of the light absorbing coating is about 10 microns to 500 microns. Optionally, prior to step 340, the light absorbing coating is cleaned with methanol or similar substance. Furthermore, optionally, prior to initial use of a wet element lens with liquid degradation protection applied using method 300 in a lithographic application, the wet lens element is soaked in an immersion liquid to allow initial leaching of organic material from the polyurethane. In one embodiment the soak period is about two days. Following soaking, the leaching decreases to an acceptable level for use within an immersion lithographic apparatus. In step 350, method 300 ends.

Additional steps or enhancements to the above steps known to persons skilled in the relevant art(s) from the teachings herein are also encompassed by the present invention.

Figure 4A:
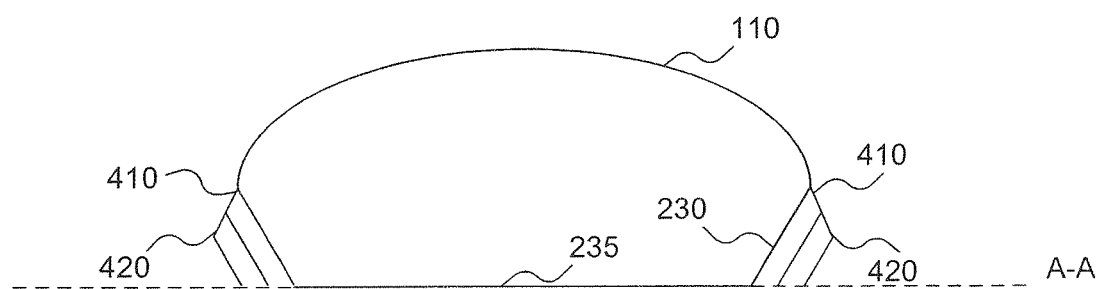
FIG. 4A is a diagram of a side view of a wet lens element having a metal oxide and liquid shield coating, according to an embodiment of the present invention.
Figure 4B:
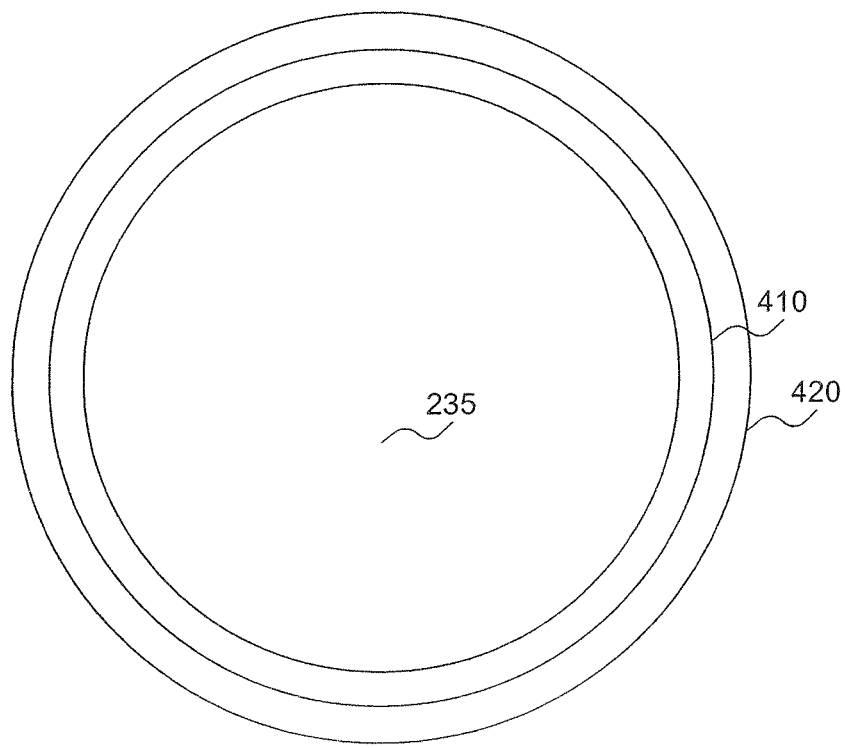
FIG. 4B is a diagram of a top-down view of a wet lens element having a metal oxide and liquid shield coating, according to an embodiment of the present invention.

FIGS. 4A and 4B provide diagrams of a side view and top-down view of wet lens element 110 having a metal oxide coating and liquid shield coating, according to an embodiment of the invention. FIGS. 4A and 4B illustrate wet lens element 110 after method 300 has been implemented. Specifically, FIG. 4A shows a metal oxide coating 410 that coats the side portions of wet lens element 110. As discussed above, metal oxide coating 410 can include a variety of different metal oxide films. Metal oxide films with the appropriate characteristics of optical absorption, optical transmission, mechanical robustness, and ability to adhere to optical materials, include, but are not limited to $SiO_2$, $Al_2O_5$, $ZrO_2$, $HfO_2$, $Ta_2O_5$, $Nb_2O_5$, and $TiO_2$.

Placed on top of this coating, per step 340, is liquid shield coating 420. As discussed above potential liquid shield coatings include, but are not limited to polyurethane, ultra-violet cure polyurethane, silicon caulks and other organic encapsulates. FIG. 4B shows a top-down view of wet lens element 110 that illustrates that metal oxide coating 410 and liquid shield coating 420 wrap completely around the side portions of wet lens element 110 that will be submersed in an immersion liquid.

Figure 5:
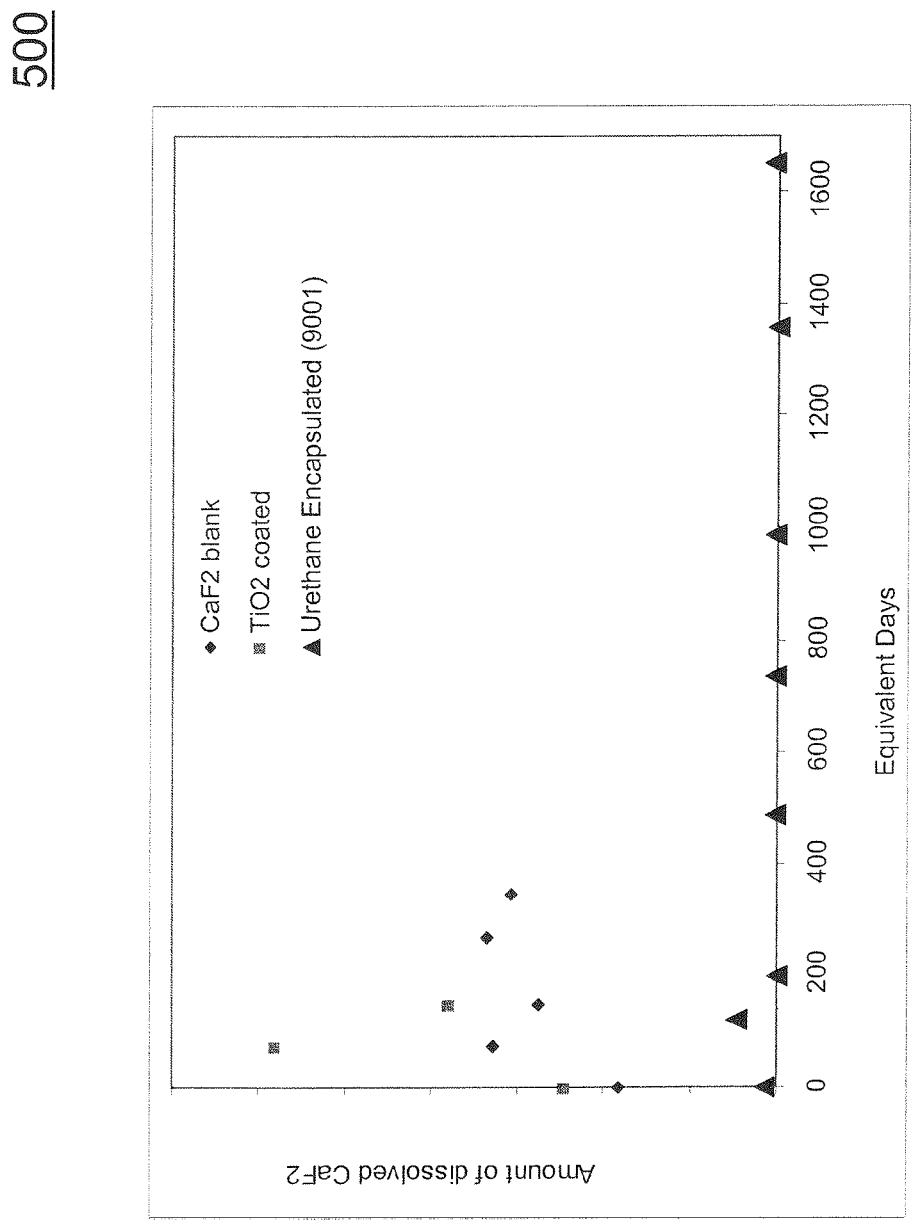
FIG. 5 is a plot of test results showing wet lens element degradation in an immersion liquid.

FIG. 5 provides a plot 500 of test results showing wet lens element degradation in an immersion liquid. FIG. 5 provides the results of accelerated dissolution tests that compare the degradation of an untreated $CaF_2$ lens, a CaF2 lens with only a $TiO_2$ coating and a $CaF_2$ lens with both a $TiO_2$ coating and a liquid shield coating of polyurethane that were applied using method 300. The lens were each 1.5 inches in diameter and about 0.375 inches thick. The immersion liquid was water. The plot shows the amount of $CaF_2$ dissolved along the vertical axis against equivalent days of immersion along the horizontal axis. The data show that the $CaF_2$ lens coated with both the metal oxide coating and liquid shield coating have nearly zero dissolution for as many as 1200 days. The untreated $CaF_2$ lens, by contrast has significant dissolution. For example, with no treatment the level of dissolution is about three times above acceptable levels. Similarly, the $TiO_2$ coated lens had significant degradation. Thus, plot 500 illustrates the significant degradation improvement of a lens coated with a metal oxide coating and a liquid shield coating, as per method 300.

An exemplary embodiment of a wet lens element having coated edge sides according to the method described in FIG. 3 has been presented. The present invention is not limited to this example. This example is presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the present invention. In particular, the invention is not limited to the particular type of lens illustrated herein. The invention can be applied to any type of lens element that has non-optical portions that will be submersed in an immersion liquid.

CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention.

What is claimed is:

1. A projection optics system within an immersion lithography system comprising:
   a series of optical elements;
   a wet lens element having an object-side surface, an image-side optical surface, and a non-optical surface between the object-side surface and the image-side optical surface;
   a metal oxide layer on the non-optical surface;
   a polyurethane liquid shield coating that covers the metal oxide coating, wherein the polyurethane liquid shield coating is configured to be in contact with a liquid such that the metal oxide coating is protected from contact with the liquid,
   wherein the metal oxide coating is opaque to ultra-violet wavelengths.

2. The projection optics system of claim 1, wherein the wet lens element comprises $CaF_2$.

3. The projection optics system of claim 1, wherein the metal oxide coating comprises $SiO_2$, $Al_2O_5$, $ZrO_2$, $HfO_2$, $Ta_2O_5$, $Nb_2O_5$, or $TiO_2$.

4. The projection optics system of claim 1, wherein the polyurethane liquid shield coating comprises ultra violet cure polyurethane.

5. The projection optics system of claim 1, wherein the polyurethane liquid shield coating is in the range from 10 to 500 microns.

6. The projection optics system of claim 1, wherein the metal oxide coating and the polyurethane liquid shield coating protect the wet lens element from liquid degradation when the wet lens element is submerged in an immersion liquid.

7. The projection optics system of claim 1, wherein the metal oxide coating is applied to a thickness of about one nanometer to not more than about two hundred micrometers.

8. The projection optics system of claim 1, wherein the metal oxide coating is formed by exposing an organoxy metallic compound to ultra-violet light.

9. The projection optics system of claim 8, wherein the organoxy metallic compound comprises an organo-titanium compound.

10. The projection optics system of claim 1, wherein the polyurethane liquid shield coating provides a water resistant coating.

11. A projection optics system, comprising:
a series of optical elements;
a wet lens element having an object-side surface, an image-side optical surface, and a non-optical surface between the object-side surface and the image-side optical surface;
a metal oxide layer on the non-optical surface;
a polyurethane layer on the metal oxide layer, wherein the polyurethane layer is configured to be in contact with a liquid such that the metal oxide layer is protected from contact with the liquid,
wherein the metal oxide layer is opaque to ultra-violet wavelength.

12. The projection optics system of claim 11, wherein the wet lens element comprises $CaF_2$.

13. The projection optics system of claim 11, wherein the metal oxide coating comprises $SiO_2$, $Al_2O_5$, $ZrO_2$, $HfO_2$, $Ta_2O_5$, $Nb_2O_5$, or $TiO_2$.

14. The projection optics system of claim 11, wherein the polyurethane layer comprises ultra violet cure polyurethane.

15. The projection optics system of claim 11, wherein the polyurethane layer has a thickness in the range from 10 to 500 microns.

16. The projection optics system of claim 11, wherein the metal oxide layer and the polyurethane layer protect the wet lens element from liquid degradation when the wet lens element is submerged in an immersion liquid.

17. The projection optics system of claim 11, wherein the metal oxide layer has a thickness of about one nanometer to not more than about two hundred micrometers.

18. The projection optics system of claim 11, wherein the metal oxide layer is formed by exposing an organoxy metallic compound to ultra-violet.

19. The projection optics system of claim 18, wherein the organoxy metallic compound comprises an organo-titanium compound.

20. The projection optics system of claim 11, wherein the polyurethane layer provides a water resistant coating.

21. A projection optics system within an immersion lithography system comprising:
a series of optical elements;
a wet lens element;
a metal oxide coating that covers a side portion of the wet lens element; and
a polyurethane liquid shield coating that covers the metal oxide coating, wherein the polyurethane liquid shield coating is configured to be in contact with a liquid such that the metal oxide coating is protected from contact with the liquid, and wherein the polyurethane liquid shield coating covering the metal oxide coating is pre-soaked in a pre-soak liquid prior to an exposure operation to decrease leaching of material from the polyurethane liquid shield coating.

\* \* \* \* \*

UNITED STATES PATENT AND TRADEMARK OFFICE
CERTIFICATE OF CORRECTION

| | | |
|---|---|---|
| PATENT NO. | : 9,195,148 B2 | |
| APPLICATION NO. | : 12/834996 | |
| DATED | : November 24, 2015 | |
| INVENTOR(S) | : Lipson et al. | |

It is certified that error appears in the above-identified patent and that said Letters Patent is hereby corrected as shown below:

In the claims,

In column 8, line 8, claim 18, after "ultra-violet", please insert --light--.

Signed and Sealed this
Fifteenth Day of March, 2016

Michelle K. Lee
*Director of the United States Patent and Trademark Office*